(12) United States Patent
Hong et al.

(10) Patent No.: US 10,802,064 B2
(45) Date of Patent: Oct. 13, 2020

(54) ELECTROMAGNETIC WAVE IMPEDANCE MEASURING APPARATUS AND CALIBRATION METHOD OF IMPEDANCE

(71) Applicant: Korea Research Institute of Standards and Science, Daejeon (KR)

(72) Inventors: Young-Pyo Hong, Cheongju-si (KR); Hyunji Koo, Daejeon (KR); No-Weon Kang, Daejeon (KR); Dong-Joon Lee, Seoul (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 51 days.

(21) Appl. No.: 16/332,349

(22) PCT Filed: Oct. 27, 2016

(86) PCT No.: PCT/KR2016/012116
§ 371 (c)(1),
(2) Date: Mar. 11, 2019

(87) PCT Pub. No.: WO2018/074646
PCT Pub. Date: Apr. 26, 2018

(65) Prior Publication Data
US 2019/0235000 A1 Aug. 1, 2019

(30) Foreign Application Priority Data

Oct. 17, 2016 (KR) .................. 10-2016-0134613

(51) Int. Cl.
*G01R 35/00* (2006.01)
*G01R 27/28* (2006.01)
(Continued)

(52) U.S. Cl.
CPC ............ *G01R 27/28* (2013.01); *G01R 29/08* (2013.01); *G01R 29/0892* (2013.01);
(Continued)

(58) Field of Classification Search
CPC ........ G01R 27/02; G01R 27/28; G01R 27/32; G01R 29/0892; G01R 31/2853;
(Continued)

(56) References Cited

U.S. PATENT DOCUMENTS

| 5,646,536 A | 7/1997 | Ishihara |
| 5,661,404 A | 8/1997 | Yanagawa et al. |

(Continued)

FOREIGN PATENT DOCUMENTS

| DE | 20-2008-013687 | 10/2008 |
| GB | 2292616 A | 2/1996 |

(Continued)

OTHER PUBLICATIONS

International Search Report; International Searching Authority/KR dated Jul. 17, 2017; International Application No. PCT/KR2016/012116; 2 pgs.; International Searching Authority/Korean Intellectual Property Office; Daejeon, Republic of Korea.

(Continued)

*Primary Examiner* — Thang X Le
(74) *Attorney, Agent, or Firm* — Andrew D. Fortney; Central California IP Group, P.C.

(57) ABSTRACT

An electromagnetic wave impedance measuring apparatus includes a network analyzer, configured to measure scattering parameters according to a frequency, including a first port and a second port; and a multilayer substrate, connected to the first port and the second port by a coaxial cable, having a via connecting conductive layers to each other and including three or more conductive layers including at least an uppermost layer, a lowermost layer, and an intermediate (Continued)

layer. The multilayer substrate includes a test sample disposed between the uppermost layer and the lowermost layer; a through calibration standard disposed between the uppermost layer and the lowermost layer; a reflect calibration standard disposed between the uppermost layer and the lowermost layer; and a line calibration standard disposed between the uppermost layer and the lowermost layer. Each of the test sample, the through calibration standard, the reflect calibration standard, and the line calibration standard is connected by a first error box, having the via, and a second error box having the via of the same structure as the via of the first error box.

9 Claims, 14 Drawing Sheets

(51) Int. Cl.
G01R 29/08 (2006.01)
G01R 31/28 (2006.01)
H01L 23/498 (2006.01)
G01R 31/319 (2006.01)
H01L 23/538 (2006.01)

(52) U.S. Cl.
CPC ....... *G01R 31/2853* (2013.01); *G01R 31/319* (2013.01); *G01R 31/3191* (2013.01); *G01R 35/00* (2013.01); *H01L 23/49827* (2013.01); *H01L 23/538* (2013.01)

(58) Field of Classification Search
CPC ............ G01R 31/2843; G01R 31/2837; G01R 31/2805; G01R 31/3191; G01R 35/005
See application file for complete search history.

(56) References Cited

U.S. PATENT DOCUMENTS

| | | | | |
|---|---|---|---|---|
| 6,836,743 | B1* | 12/2004 | Blackham | G01R 35/005 324/601 |
| 7,124,049 | B2 | 10/2006 | Wong et al. | |
| 7,777,497 | B2* | 8/2010 | Albert-Lebrun | G01R 35/005 324/601 |
| 7,994,801 | B2* | 8/2011 | Hagerup | G01R 35/005 324/601 |
| 8,290,736 | B2* | 10/2012 | Tang | G01R 35/007 324/750.02 |
| 8,791,705 | B2 | 7/2014 | Zelder et al. | |
| 9,470,713 | B2 | 10/2016 | Zelder et al. | |
| 2004/0160228 | A1* | 8/2004 | Jamneala | G01R 35/005 324/601 |
| 2005/0256658 | A1* | 11/2005 | Anderson | G01R 35/005 702/90 |
| 2014/0300380 | A1* | 10/2014 | Zelder | G01D 18/00 324/754.03 |

FOREIGN PATENT DOCUMENTS

| | | |
|---|---|---|
| JP | 06088844 A | 3/1994 |
| JP | 10197577 A | 7/1998 |
| JP | 2807177 B2 | 10/1998 |
| JP | 2866011 B2 | 3/1999 |
| KR | 1020110070902 A | 6/2011 |

OTHER PUBLICATIONS

Lin Li et al; "On the Thru-Reflect-Line (TRL) Numerical Calibration and Error Analysis for Parameter Extraction of Circuit Model"; Wiley Periodicals, Inc.; 2006; pp. 470-482; Wiley InterScience.

Glenn F. Engen et al.; "'Thru-Reflect-Line': An Improved Technique for Calibrating the Dual Six-Port Automatic Network Analyzer"; IBBE Transactions Microwave Theory and Techniques; Dec. 1979; pp. 987-993; vol. MTT-27, No. 12.

* cited by examiner

ELECTROMAGNETIC WAVE IMPEDANCE MEASURING APPARATUS AND CALIBRATION METHOD OF IMPEDANCE

CROSS-REFERENCE TO RELATED APPLICATIONS

This application is a continuation of and claims priority to PCT/KR2016/012116 filed on Oct. 27, 2016, which claims priority to Korea Patent Application No. 10-2016-0134613 filed on Oct. 17, 2016, the entireties of which are both hereby incorporated by reference.

TECHNICAL FIELD

The present disclosure relates to an electromagnetic wave impedance measuring apparatus and, more particularly, to impedance measuring apparatus and calibration method based on thru-reflect-line (TRL) calibration.

BACKGROUND

In a printed circuit board (PCB) circuit and a semiconductor-based integrated chip (IC) design having high integration density, a multilayer structure is inevitably used to reduce a chip area. In general, interlayer connection is performed through discontinuities (or vias). In the case of a high-speed semiconductor integrated circuit, a sample (for example, a transmission line, device, or circuit) having electrical characteristics to be measured is far from a measurement plane.

In the case in which a transmission line having discontinuities (or vias) is designed and manufactured, impedance mismatch makes it difficult to independently measure impedance or scattering parameters of a sample to be measured. As an operating frequency is increased more than tens of gigahertz (GHz), an issue of the impedance mismatch becomes more serious.

In a transmission line, electrical characteristics of a device are represented by network parameters such as impedance Z, admittance Y, a scattering parameter S, and an ABCD parameter. However, as a frequency is increased, a distance between a device under test (DUT) to be measured and an actual measurement plane makes it difficult to accurately measure network parameters.

Accordingly, a measurement result, in which a measurement error term is removed, should be obtained to accurately evaluate a device under test (DUT) to be measured. To this end, precise calibration is required.

U.S. Pat. No. 7,124,049 discloses a calibration method using a network analyzer. However, it is difficult to apply U.S. Pat. No. 7,124,049 to a multilayer substrate having vias.

SUMMARY

An aspect of the present disclosure is to provide a method of precisely calibrating impedance of a transmission line having discontinuities (vias) to accurately evaluate an device (a transmission line, circuit, or device) to be measured.

According to an aspect of the present disclosure, an electromagnetic wave impedance measuring apparatus includes a network analyzer, configured to measure scattering parameters according to a frequency, including a first port and a second port; and a multilayer substrate, connected to the first port and the second port by a coaxial cable, having a via connecting conductive layers to each other and including three or more conductive layers including at least an uppermost layer, a lowermost layer, and an intermediate layer. The multilayer substrate includes a test sample disposed between the uppermost layer and the lowermost layer; a through calibration standard disposed between the uppermost layer and the lowermost layer; a reflect calibration standard disposed between the uppermost layer and the lowermost layer; and a line calibration standard disposed between the uppermost layer and the lowermost layer. Each of the test sample, the through calibration standard, the reflect calibration standard, and the line calibration standard is connected by a first error box, having the via, and a second error box having the via of the same structure as the via of the first error box.

In an example embodiment, the multilayer substrate may be a four-layer printed circuit board (PCB), and the multilayer substrate may include first to fourth conductive layers from below. Each of the first error box and the second error box may include the first conductive layer including a grounded first conductive layer; the second conductive layer including a lower signal pattern; the third conductive layer including a third conductive pattern extending alongside the first conductive pattern and being grounded; and the fourth conductive layer including an upper signal pattern extending alongside the first conductive pattern. The upper signal pattern may be connected to the lower signal pattern through a first via.

In an example embodiment, in the through calibration standard, the lower signal pattern of the first error box and the lower single pattern of the second error box may be connected to each other.

In an example embodiment, in the reflect calibration standard, the lower signal pattern of the first error box may be connected to the first conductive pattern, the second conductive pattern, and an upper auxiliary pattern, disposed in the fourth conductive layer, through a second via.

In an example embodiment, in the line calibration standard, the lower signal pattern of the first error box and the lower single pattern of the second error box may be connected to each other to provide a phase difference while having a predetermined distance.

According to another aspect of the present disclosure, a calibration method of electromagnetic wave impedance includes providing a test sample, a through calibration standard, a reflect calibration standard, and a line calibration standard, connected through a first error box having a via and connected to a first port and a second error box having a via and connected to a second port, to a multilayer substrate; measuring a measured through scattering parameter $S_M^{Thru}$ of the through calibration standard, a measured reflection scattering parameter $S_M^{Reflect}$ of the reflect calibration standard, and a measured line scattering parameter $S_M^{Line}$ of the line calibration standard through a network analyzer, respectively; calculating error terms, constituting the first error box and the second error box, using the measured through scattering parameter $S_M^{Line}$, the measured reflection scattering parameter $S_M^{Reflect}$, and the measured line scattering parameter $S_M^{Line}$, measuring a measured test sample scattering parameter $S_M^{DUT}$ of the test sample through the network analyzer; and extracting the measured test sample scattering parameter $S_M^{DUT}$ of the test sample using the error terms, constituting the first error box and the second error box, and extracting a scattering parameter $S^{DUT}$ of the test sample using terms constituting the first error box and the second error box.

In an example embodiment, the calculating error terms constituting the first error box and the second error box may include transforming the measured through scattering parameter $S_M^{Thru}$, the measured reflection scattering parameter $S_M^{Reflect}$, and the measured line scattering parameter $S_M^{Line}$ into a measured through scattering transfer parameter $T_M^{Thru}$, a measured reflection scattering transfer parameter $T_M^{Reflect}$, and a measured line scattering transfer parameter $T_M^{Line}$, respectively; and calculating error terms by operating the measured through scattering transfer parameter $T_M^{Thru}$, the measured reflection scattering transfer parameter $T_M^{Reflect}$, and the measured line scattering transfer parameter $T_M^{Line}$ using an equation below, $$T_M = \frac{1}{e_{10}e_{32}}\begin{bmatrix} -\Delta_X & e_{00} \\ -e_{11} & 1 \end{bmatrix} T \begin{bmatrix} -\Delta_Y & e_{22} \\ -e_{33} & 1 \end{bmatrix}$$

where $e_{00}$ denotes directivity of a first error box, $e_{33}$ denotes directivity of a second error box, $e_{11}$ denotes a first port match, $e_{22}$ denotes a second port match, $e_{10}e_{32}$ denotes transmission tracking, $\Delta_X = e_{00}e_{11} - e_{10}e_{01}$ denotes a determinant of an error matrix of the first error box, and $\Delta_Y = e_{22}e_{33} - e_{32}e_{23}$ denotes a determinant of an error matrix of the second error box.

In an example embodiment, the calculating error terms may include calculating $e_{00}$, $e_{33}$, $e_{10}e_{01}/e_{11}$, and $e_{32}e_{23}/e_{22}$ using the measured line scattering transfer parameter $T_M^{Line}$ and the measured through scattering transfer parameter $T_M^{Thru}$; calculating $e_{11}$ and $e_{22}$ using the measured through scattering transfer parameter $T_M^{Thru}$ and the measured reflection scattering transfer parameter $T_M^{Reflect}$; obtaining $e_{10}e_{01}$ using $e_{11}$ and $e_{10}e_{01}/e_{11}$ and obtaining $e_{32}e_{23}$ using $e_{22}$ and $e_{32}e_{23}/e_{22}$; and obtaining $e_{10}e_{32}$ using an equation below.

$$S_{21M}^{Thru} = (e_{10}e_{32})\frac{1}{1-e_{11}e_{22}}$$

In an example embodiment, the test sample, the through calibration standard, the reflect calibration standard, and the line calibration standard may disposed on the same substrate.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

Figure 1:
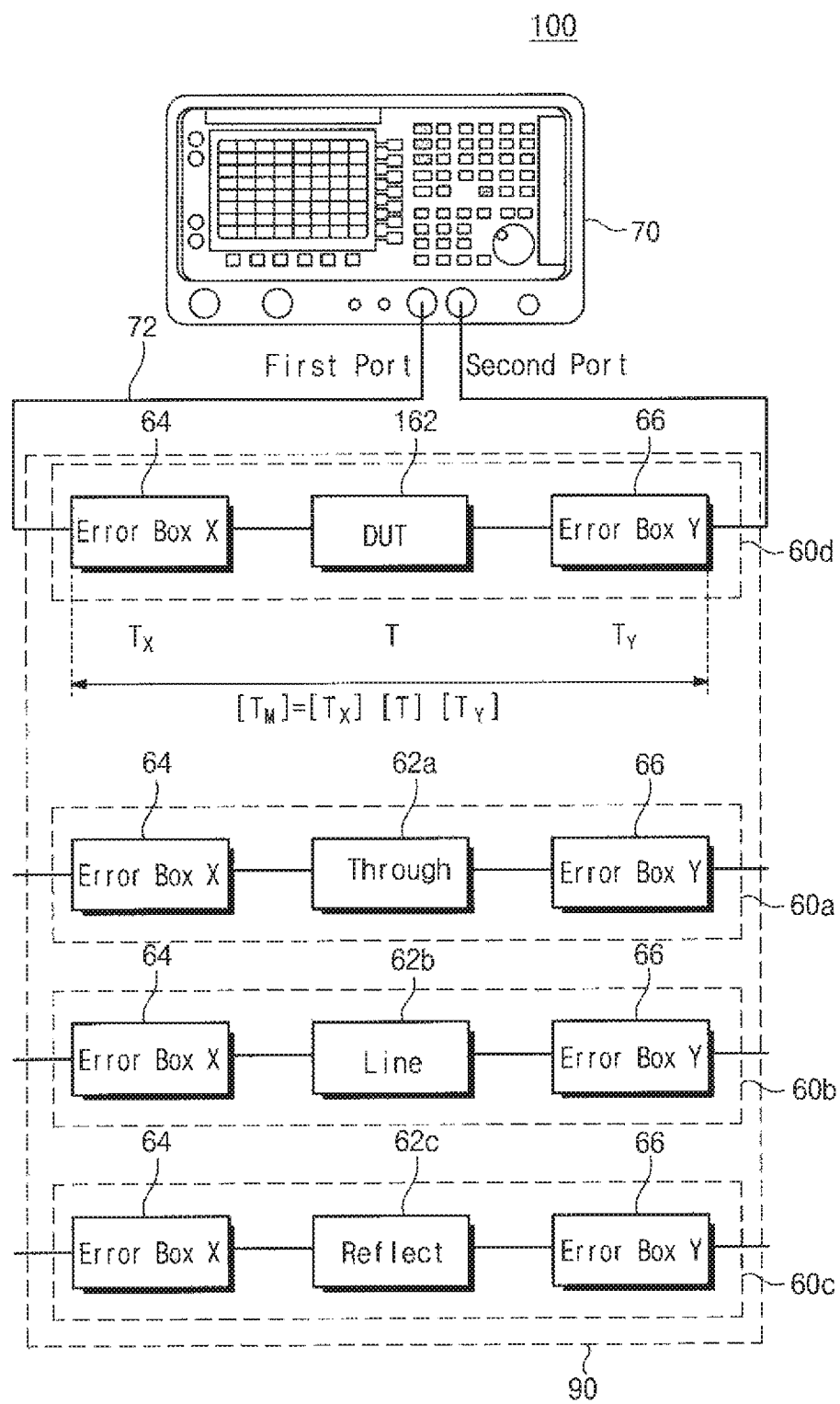
FIG. 1 is a conceptual diagram illustrating an electromagnetic wave impedance measuring apparatus according to an example embodiment of the present disclosure.

62a: the through calibration standard
62b: the line calibration standard
62c: the reflect calibration standard
64: the first error box
66: the second error box
70: the network analyzer
72: the coaxial cable
162: the test sample

DETAILED DESCRIPTION

A multilayer printed circuit board (PCB) may have an interconnection structure including microstrip lines and strip line through vias. Since a PCB area may be efficiently used, the multilayer PCB is widely used for miniaturization.

A multilayer PCB may be a four-layer substrate structure in which a microstrip line structure, including a ground layer and a signal layer, and a strip line structure, including a signal layer between a pair of ground layers, are coupled with each other.

Since measurement cannot be performed by directly connecting a port of a measuring apparatus to a via present in a multilayer PCB, electrical performance of the via cannot be directly measured. Furthermore, since interfaces (a transmission line, an adapter, a pad, a via, and the like) are always present between a port of the measuring apparatus and a device under test (DUT), electrical characteristics of an interface should be excluded to measure electrical performance of the DUT itself.

To address the above issue, an interface de-embedding method based on through-reflect-line (TRL) calibration is proposed.

According to the present disclosure, through-reflect-line (TRL) calibration standard and test sample for calibration were fabricated and evaluated on the same multilayer PCB substrate. For the through-reflect-line (TRL) calibration, a first error box and a second error box, respectively connected to both sides of a DUT, were modeled as an eight-term error model. The eight-term error model may simultaneously form a through-reflect-line (TRL) calibration standard and a test sample on a multilayer PCB substrate to provide accurate calibration.

Example embodiments of the present disclosure will now be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

Reference numerals are indicated in detail in example embodiments of the present disclosure, and their examples are represented in reference drawings. In every possible case, like reference numerals are used for referring to the same or similar elements in the description and drawings.

FIG. 1 is a conceptual diagram illustrating an electromagnetic wave impedance measuring apparatus according to an example embodiment of the present disclosure.

Figure 2:
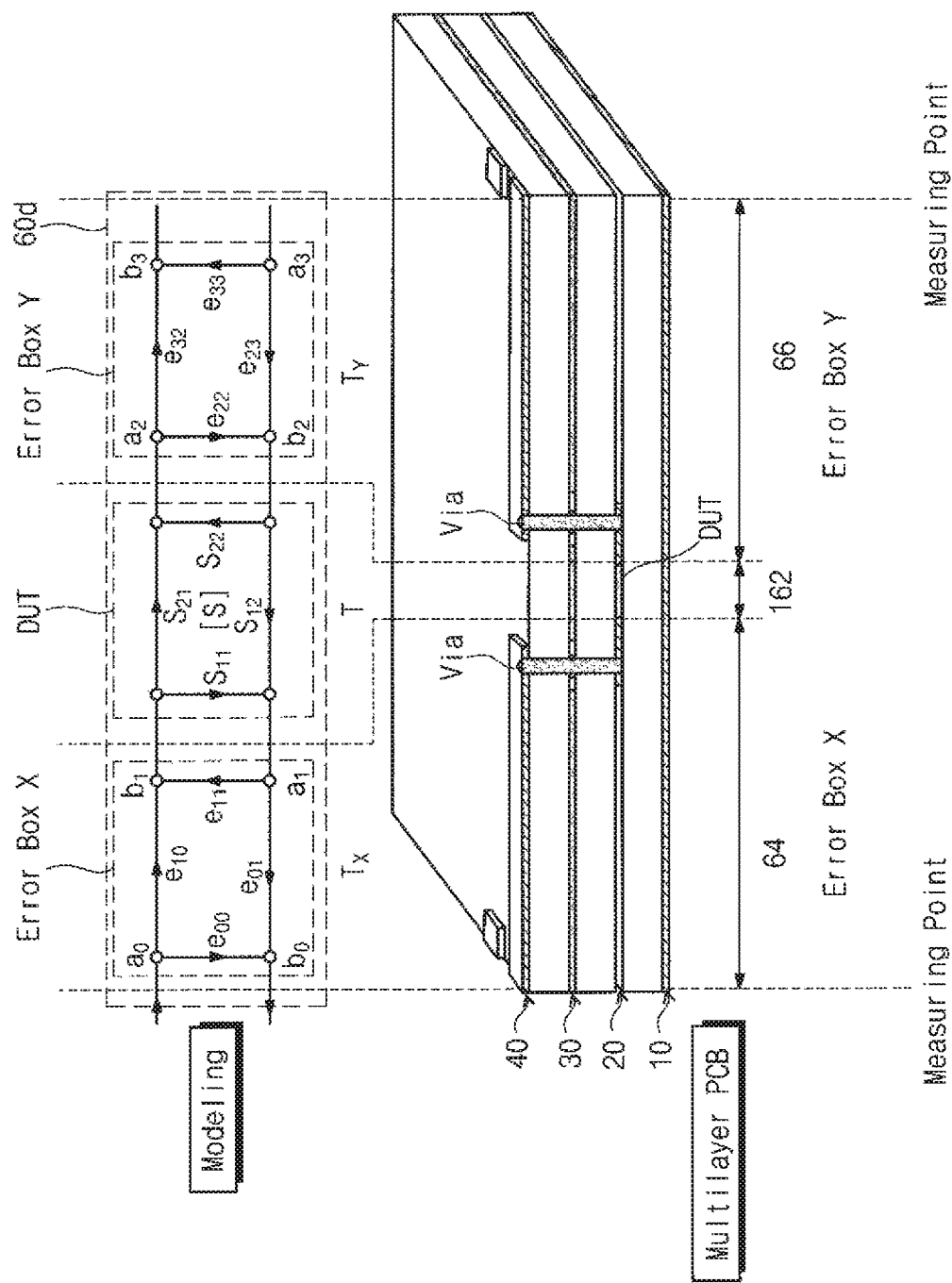
FIG. 2 is an equivalent circuit diagram of a first error box, a test sample, and a second error box and illustrates a geometric structure thereof.

FIG. 2 is an equivalent circuit diagram of a first error box, a test sample, and a second error box and illustrates a geometric structure thereof.

Figure 3:
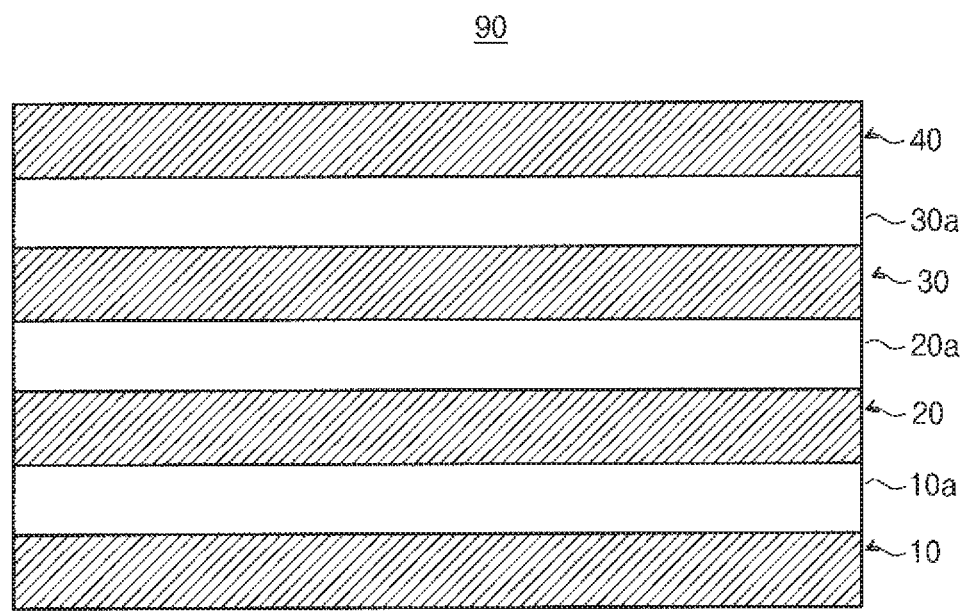
FIG. 3 is a cross-sectional view illustrating a structure of a substrate.

FIG. 3 is a cross-sectional view illustrating a structure of a substrate.

Figure 4:
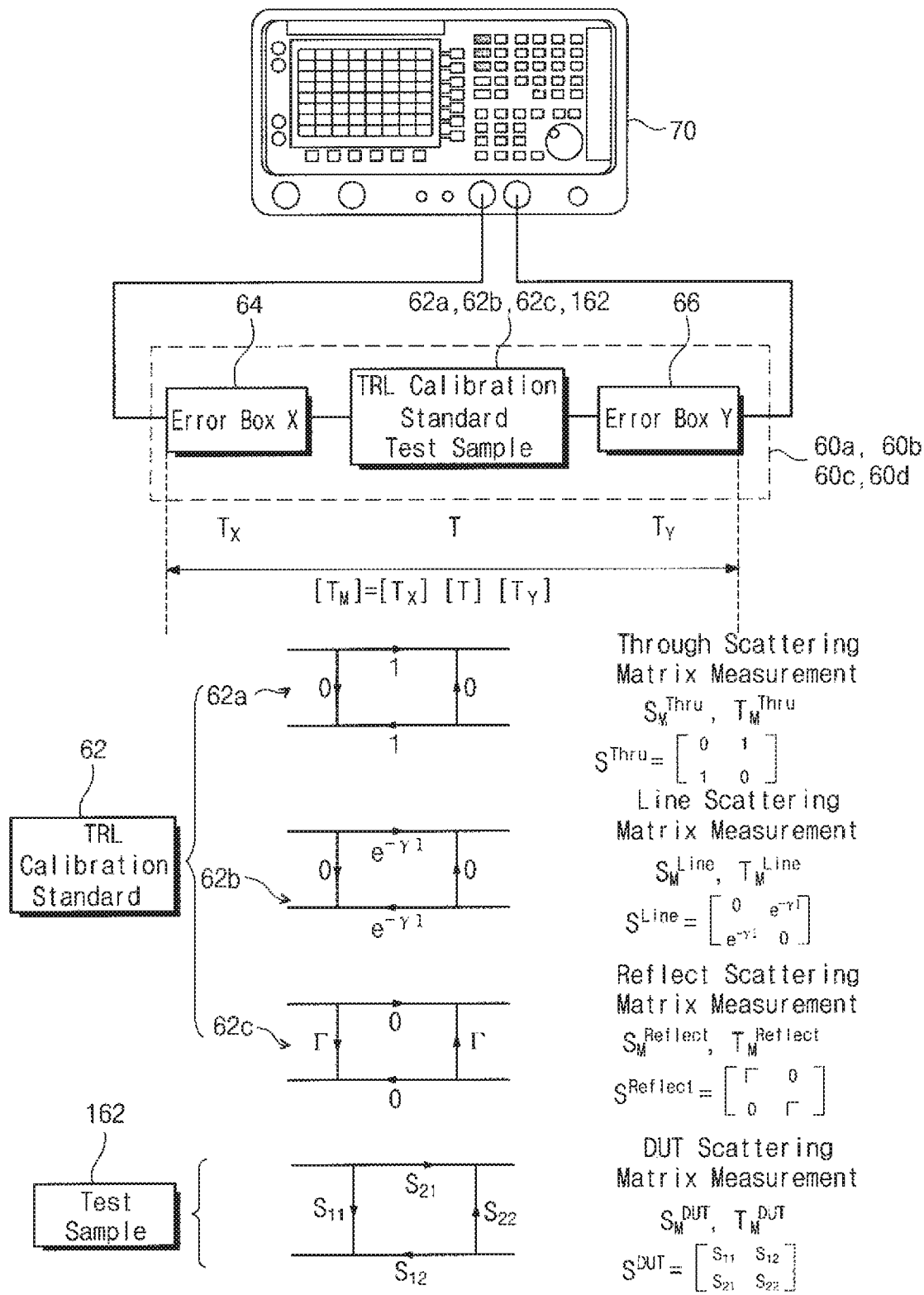
FIG. 4 illustrates a TRL calibration test of the electromagnetic wave impedance measuring apparatus in FIG. 1 and a test sample as represented by a circuit.

FIG. 4 illustrates a TRL calibration test of the electromagnetic wave impedance measuring apparatus in FIG. 1 and a test sample as represented by a circuit.

Figure 5:
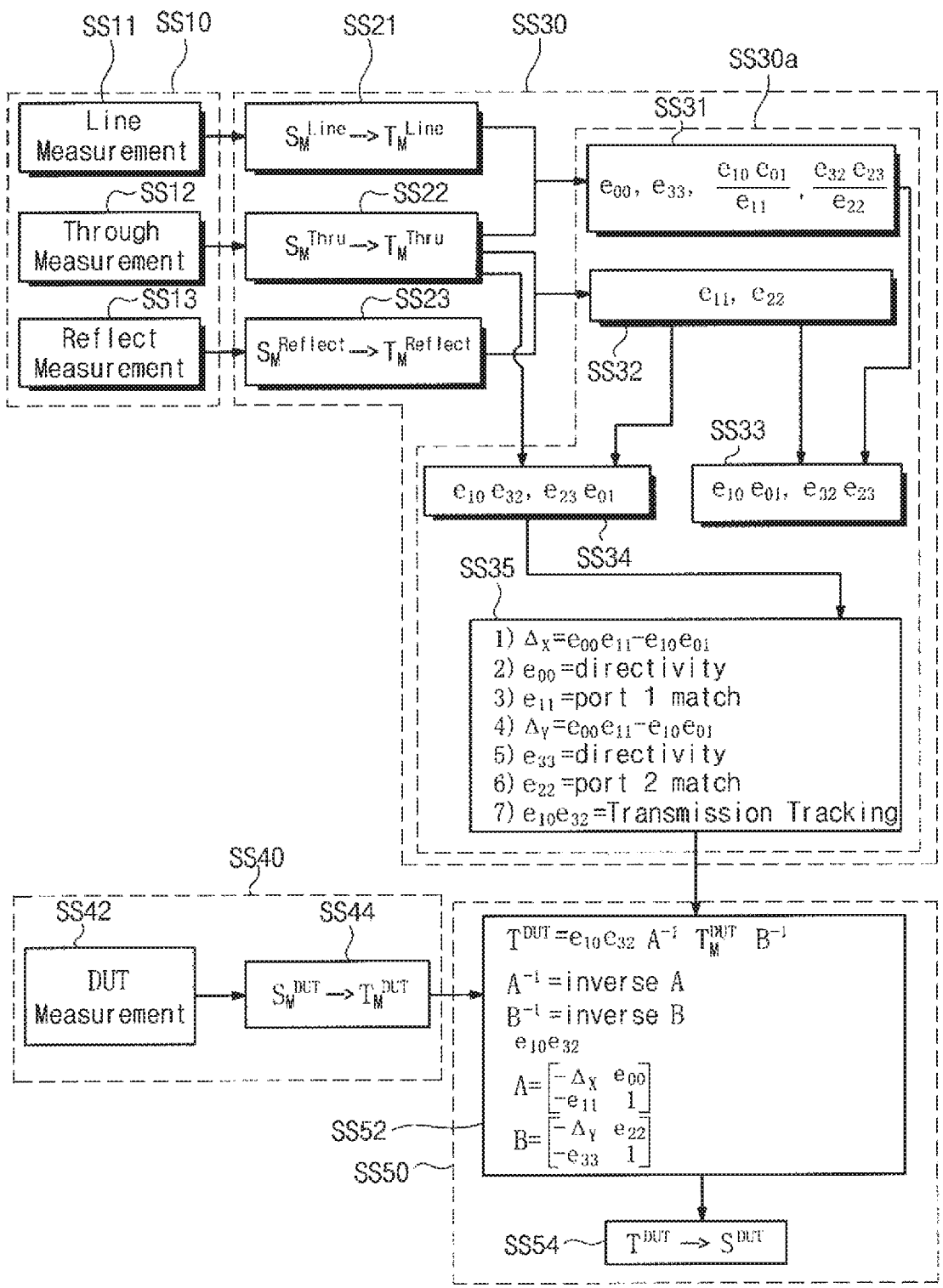
FIG. 5 is a conceptual diagram illustrating a calculation method of an electromagnetic wave impedance measuring method.

FIG. 5 is a conceptual diagram illustrating a calculation method of an electromagnetic wave impedance measuring method.

Figure 6:
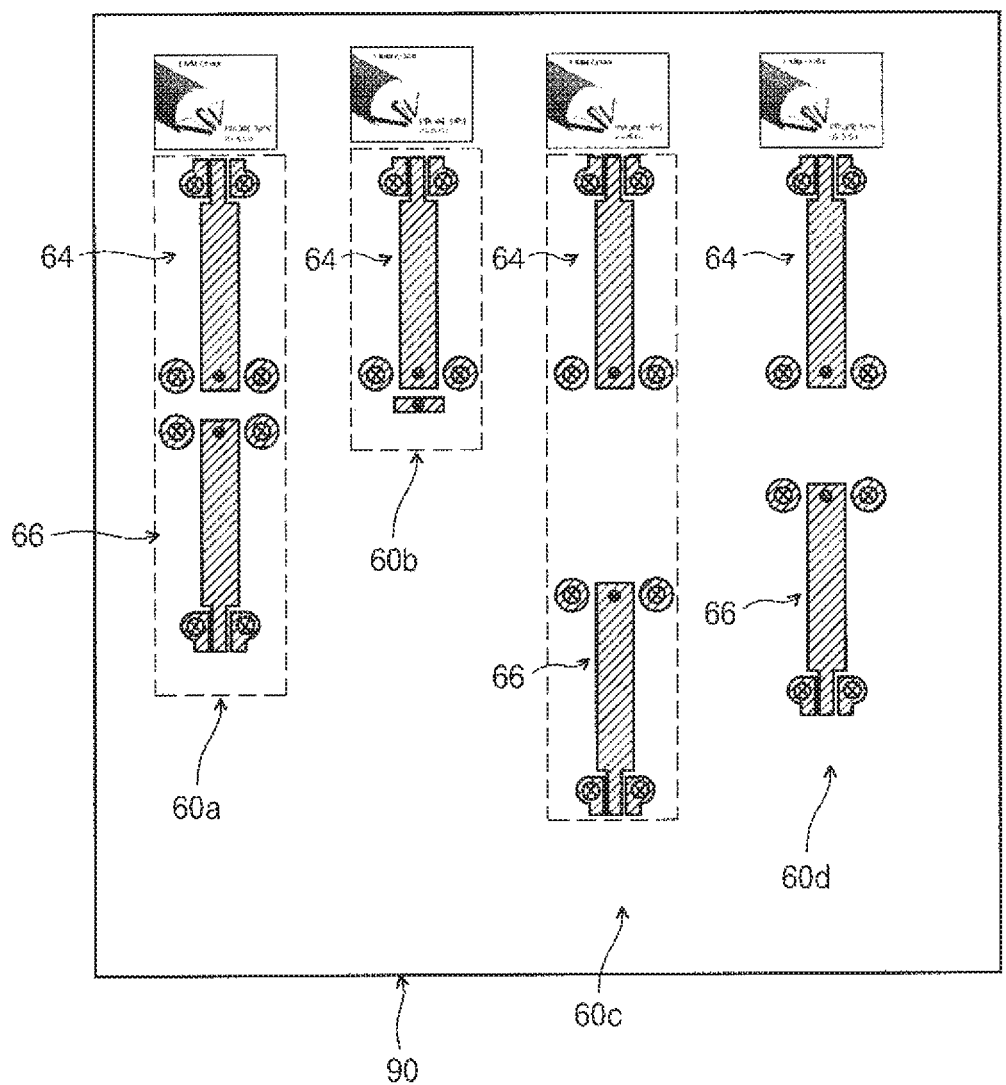
FIG. 6 is a plan view of a TRL calibration standard and a test sample.

FIG. 6 is a plan view of a TRL calibration standard and a test sample.

Referring to FIGS. 1 to 6, an electromagnetic wave impedance measuring apparatus 100 includes a network analyzer 70, configured to measure scattering parameters according to a frequency, including a first port and a second port, and a multilayer substrate 90, connected to the first port and the second port by a coaxial cable 72, having a via connecting conductive layers to each other and including three or more conductive layers including at least an uppermost layer, a lowermost layer, and an intermediate layer.

Characteristic impedance of the coaxial cable 72 may be 50 ohms. The coaxial cable 72 may have one end connected to the first port and the second port of the network analyzer 70. The coaxial cable 72 may have the other end connected to a high-frequency probe. The high-frequency probe has three probes and may be a three-terminal probe having a ground-signal-ground structure. The high-frequency probe may be connected to a pad having a coplanar waveguide structure.

The multilayer substrate 90 may include a test sample 162 disposed between the uppermost layer and the lowermost layer, a through calibration standard 62a disposed between the uppermost layer and the lowermost layer, a reflect calibration standard 62c disposed between the uppermost layer and the lowermost layer, and a line calibration standard 62b disposed between the uppermost layer and the lowermost layer. Each of the test sample 162, the through calibration standard 62a, the reflect calibration standard 62c, and the line calibration standard 62b is connected by a first error box 64, having the via, and a second error box 66 having the via of the same structure as the via of the first error box 64.

A first sample 60a includes a through calibration standard 62a, a first error box 64, and a second error box 66. A second sample 60b includes a line calibration standard 62b, a first error box, and a second error box. A third sample 60c includes a reflect calibration standard 62c, a first error box, and a second error box. A fourth sample 60d includes a test sample 162, a first error box, and a second error box. The first to fourth samples 60a to 60d are disposed on the same printed circuit board or the same semiconductor substrate.

Hereinafter, a mathematical basis for measuring the impedance or scattering parameters according to an example embodiment of the present disclosure will be described. Scattering parameters or S-parameters (elements of a scattering matrix) describe electrical characteristics of an electrical network.

$$S = \begin{bmatrix} S_{11} & S_{12} \\ S_{21} & S_{22} \end{bmatrix} \quad \text{Equation (1)}$$

In a two-port network, $S_{11}$ denotes a reflection coefficient at a first port. Scattering transfer parameters or T-parameters may be transformed from scattering parameters, as follows.

$$T = \begin{bmatrix} T_{11} & T_{12} \\ T_{21} & T_{22} \end{bmatrix} = \frac{1}{S_{21}} \begin{bmatrix} -\Delta_S & S_{11} \\ -S_{22} & 1 \end{bmatrix} \quad \text{Equation (2)}$$

$$\Delta_s = S_{11}S_{22} - S_{12}S_{21}$$

A device to be measured (a DUT or a test sample) is connected by a first error box 64, having a via, and a second error box 66 having a via.

Scattering parameters (or error parameters) $S_X$ and $S_Y$ of the first and second error boxes 64 and 66 are given, as follows.

$$S_X = \begin{bmatrix} e_{00} & e_{01} \\ e_{10} & e_{11} \end{bmatrix} \quad \text{Equation (3)}$$

$$S_Y = \begin{bmatrix} e_{22} & e_{23} \\ e_{32} & e_{33} \end{bmatrix}$$

The scattering parameters (or error parameters) $S_X$ and $S_Y$ of the first and second error boxes 64 and 66 may be transformed into T-parameters $T_X$ and $T_Y$, as follows.

$$T_X = \frac{1}{e_{10}} \begin{bmatrix} -\Delta_X & e_{00} \\ -e_{11} & 1 \end{bmatrix} \quad \text{Equation (4)}$$

$$T_Y = \frac{1}{e_{32}} \begin{bmatrix} -\Delta_Y & e_{22} \\ -e_{33} & 1 \end{bmatrix}$$

$$\Delta_X = e_{00}e_{11} - e_{10}e_{01}$$

$$\Delta_Y = e_{22}e_{33} - e_{32}e_{23}$$

A measured T-parameter $T_M$ is given by the first error box 64 and the second error box 66 from a T-parameter T of an actual device, as follows.

$$T_M = T_X \, T \, T_Y = \quad \text{Equation (5)}$$

$$\frac{1}{e_{10}e_{32}} \begin{bmatrix} -\Delta_X & e_{00} \\ -e_{11} & 1 \end{bmatrix} T \begin{bmatrix} -\Delta_Y & e_{22} \\ -e_{33} & 1 \end{bmatrix} = \frac{1}{e_{10}e_{32}} ATB$$

$$A = \begin{bmatrix} -\Delta_X & e_{00} \\ -e_{11} & 1 \end{bmatrix}$$

$$B = \begin{bmatrix} -\Delta_Y & e_{22} \\ -e_{33} & 1 \end{bmatrix}$$

where $e_{00}$ denotes directivity of a first error box, $e_{33}$ denotes directivity of a second error box, $e_{11}$ denotes a first port match, $e_{22}$ denotes a second port match, $e_{10}e_{32}$ denote transmission tracking, $\Delta_X = e_{00}e_{11} - e_{10}e_{01}$ denotes a determinant of an error matrix of the first error box, and $\Delta_Y = e_{22}e_{33} - e_{32}e_{23}$ denotes a determinant of an error matrix of the second error box.

A calibration method of electromagnetic wave impedance according to an example embodiment of the present disclosure includes providing a test sample, a through calibration standard, a reflect calibration standard, and a line calibration standard, connected through a first error box having a via and connected to a first port and a second error box having a via and connected to a second port, to a multilayer substrate. Structures of the test sample, the through calibration standard, the reflect calibration standard, and the line calibration standard will be described later.

A measured through scattering parameter $S_M^{Thru}$ of the through calibration standard, a measured reflection scattering parameter $S_M^{Reflect}$ of the reflect calibration standard, and a measured line scattering parameter $S_M^{Line}$ of the line calibration standard are measured through a network analyzer, respectively (SS10).

Through TRL calibration standard measurement, the measured through scattering parameter $S_M^{Thru}$, the measured reflection scattering parameter $S_M^{Reflect}$, and the measured line scattering parameter $S_M^{Line}$ are measured using the network analyzer 70 to be obtained, respectively (SS11, SS12, and SS13).

Error terms, constituting the first error box and the second error box, are calculated using the measured through scattering parameter $S_M^{Thru}$, the measured reflection scattering parameter $S_M^{Reflect}$, and the measured line scattering parameter $S_M^{Line}$ (SS30a).

To calculate the error terms, constituting the first error box and the second error box, a through scattering transfer parameter $T^{Thru}$, a reflection scattering transfer parameter $T^{Reflect}$, and a line scattering transfer parameter $T^{Line}$ are transformed from given S-parameters and calculated, respectively.

$$S^{Thru} = \begin{bmatrix} 0 & 1 \\ 1 & 0 \end{bmatrix}$$

$$S^{Line} = \begin{bmatrix} 0 & e^{-\gamma l} \\ e^{-\gamma l} & 0 \end{bmatrix}$$

$$S^{Reflect} = \begin{bmatrix} \Gamma & 0 \\ 0 & \Gamma \end{bmatrix}$$

Equation (6)

where $\Gamma$ denotes a reflection coefficient, $\Gamma$ denotes a propagation constant, and l denotes a length of a line.

Error terms of an 8-term error box may be determined using the measured through scattering transfer parameter $T_M^{Thru}$, the measured reflect scattering-transfer parameter $T_M^{Reflect}$, the measured line scattering-transfer parameter $T_M^{Line}$, and Equations (5) and (6).

More specifically, $e_{00}$, $e_{33}$, $e_{10}e_{01}/e_{11}$, $e_{32}e_{23}/e_{22}$ are obtained using the measured line scattering-transfer parameter $T_M^{Line}$, the measured through scattering transfer parameter $T_M^{Thru}$, and Equation (5) (SS31).

Next, $e_{11}$ and $e_{22}$ are calculated using the measured through scattering transfer parameter $T_M^{Thru}$, the measured reflect scattering-transfer parameter $T_M^{Reflect}$, and Equation (5) (SS32).

Next, $e_{10}e_{01}$ is obtained using $e_{11}$ and $e_{10}e_{01}/e_{11}$. In addition, $e_{32}e_{23}$ is obtained using $e_{22}$ and $e_{32}e_{23}/e_{22}$ (SS33).

In addition, $e_{10}e_{32}$ and $e_{23}e_{01}$ are obtained using an equation below (SS34).

$$S_{21M}^{Thru} = (e_{10}e_{32})\frac{1}{1-e_{11}e_{22}}$$

Equation (7)

An error term is given, as follows (SS35).

Equation (8)

$\Delta_X = e_{00}e_{11} - e_{10}e_{01}$      1)

$e_{00}$ = directivity      2)

$e_{11}$ = port 1 match      3)

$\Delta_Y = e_{22}e_{33} - e_{32}e_{23}$      4)

$e_{33}$ = directivity      5)

$e_{22}$ = port 2 match      6)

$e_{10}e_{32}$ = transmission Tracking      7)

When the error terms in Equation (8) are obtained, the test sample may be calibrated (SS40). More specifically, a measured test sample scattering parameter $S_M^{DUT}$ of the test sample is measured through the network analyzer (SS42). The measured test sample scattering parameter $S_M^{DUT}$ may be transformed into a measured test sample scattering transfer parameter $T_M^{DUT}$ (SS44).

The measured test sample scattering parameter $S_M^{DUT}$ of the test sample is extracted using the error terms constituting the first error box and the second error box, and a scattering parameter $S^{DUT}$ of the test sample is extracted using terms constituting the first error box and the second error box (SS50).

More specifically, the test sample scattering-transfer parameter $T^{DUT}$ for a DUT (or a test sample) may be calculated from the measured test sample scattering parameter $S_M^{DUT}$ or the measured test sample scattering-transfer parameter $T_M^{DUT}$, as follows (SS52).

$T^{DUT} = e_{10}e_{32}A^{-1}T_M^{DUT}B^{-1}$ $A^{-1}$ = inverse A $B^{-1}$ = inverse B      Equation (9)

Next, the scattering transfer parameter $T^{DUT}$ may be transformed into the scattering parameter $S^{DUT}$ to be shown (SS54).

In conclusion, the calibration method of electromagnetic wave impedance may be performed, as follows. The calibration method may include providing a test sample, a through calibration standard, a reflect calibration standard, and a line calibration standard, connected through a first error box having a via and connected to a first port and a second error box having a via and connected to a second port, to a multilayer substrate; measuring a measured through scattering parameter $S_M^{Thru}$ of the through calibration standard, a measured reflection scattering parameter $S_M^{Reflect}$ of the reflect calibration standard, and a measured line scattering parameter $S_M^{Line}$ of the line calibration standard through a network analyzer, respectively (S10); calculating error terms, constituting the first error box and the second error box, using the measured through scattering parameter $S_M^{Thru}$, the measured reflection scattering parameter $S_M^{Reflect}$, and the measured line scattering parameter $S_M^{Line}$ (SS30); measuring a measured test sample scattering parameter $S_M^{DUT}$ of the test sample through the network analyzer (SS40); and extracting the measured test sample scattering parameter $S_M^{DUT}$ of the test sample using the error terms, constituting the first error box and the second error box, and extracting a scattering parameter $S^{DUT}$ of the test sample using terms constituting the first error box and the second error box (SS50).

The calculating error terms constituting the first error box and the second error box (SS30) may include transforming the measured through scattering parameter $S_M^{Thru}$, the measured reflection scattering parameter $S_M^{Reflect}$, and the measured line scattering parameter $S_M^{Line}$ into a measured through scattering transfer parameter $T_M^{Thru}$, a measured reflection scattering transfer parameter $T_M^{Reflect}$, and a measured line scattering transfer parameter $T_M^{Line}$, respectively (SS21, SS22, and SS23); and calculating error terms by operating the measured through scattering transfer parameter $T_M^{Thru}$, the measured reflection scattering transfer parameter $T_M^{Reflect}$, and the measured line scattering transfer parameter $T_M^{Line}$ using an equation below (SS30a).

$$T_M = \frac{1}{e_{10}e_{32}}\begin{bmatrix} -\Delta_X & e_{00} \\ -e_{11} & 1 \end{bmatrix}[T]\begin{bmatrix} -\Delta_Y & e_{22} \\ -e_{33} & 1 \end{bmatrix}$$

The calculating error terms (SS30a) may include calculating $e_{00}$, $e_{33}e_{01}/e_{11}$, and $e_{32}e_{23}/e_{22}$ using the measured line scattering transfer parameter $T_M^{Line}$ and the measured through scattering transfer parameter $T_M^{Thru}$ (SS31); calculating $e_{11}$ and $e_{22}$ using the measured through scattering transfer parameter $T_M^{Thru}$ and the measured reflection scattering transfer parameter $T_M^{Reflect}$ (SS32); obtaining $e_{10}e_{01}$ using $e_{11}$ and $e_{10}e_{01}/e_{11}$ and obtaining $e_{32}e_{23}$ using $e_{22}$ and $e_{32}e_{23}/e_{22}$ (SS33); and obtaining $e_{10}e_{32}$ using an equation below (S34).

$$S_{21M}^{Thru} = (e_{10}e_{32})\frac{1}{1-e_{11}e_{22}}$$

The test sample, the through calibration standard, the reflect calibration standard, and the line calibration standard may be disposed on the same substrate.

Hereinafter, a structure of a thru-reflect-line (TRL) calibration standard according to an example embodiment of the present disclosure will be described. As an example, the TRL calibration standard will be described on a multilayer substrate 90 having four conductive layers. The TRL calibration standard includes a through calibration standard 62a, a reflect calibration standard 62c, and a line calibration standard 62b.

The multilayer substrate 90 may include a test sample 162 disposed between an uppermost layer and a lowermost layer, a through calibration standard 62a disposed between the uppermost layer and the lowermost layer, a reflect calibration standard 62c disposed between the uppermost layer and the lowermost layer, and a line calibration standard 62b disposed between the uppermost layer and the lowermost layer.

Each of the test sample 162, the through calibration standard 62a, the reflect calibration standard 62c, and the line calibration standard 62b is connected by a first error box 64, having the via, and a second error box 66 having the via of the same structure as the via of the first error box 64.

The multilayer substrate 90 may be a four-layer printed circuit board (PCB). The multilayer substrate 90 may include first to fourth conductive layers 10, 20, 30, and 40 from below. A first dielectric layer 10a may be disposed between the first conductive layer 10 and the second conductive layer 20. A second dielectric layer 20a may be disposed between the second conductive layer 20 and a third conductive layer 30. A third dielectric layer 30a may be disposed between the third conductive layer 30 and a fourth conductive layer 40.

Figure 7A:
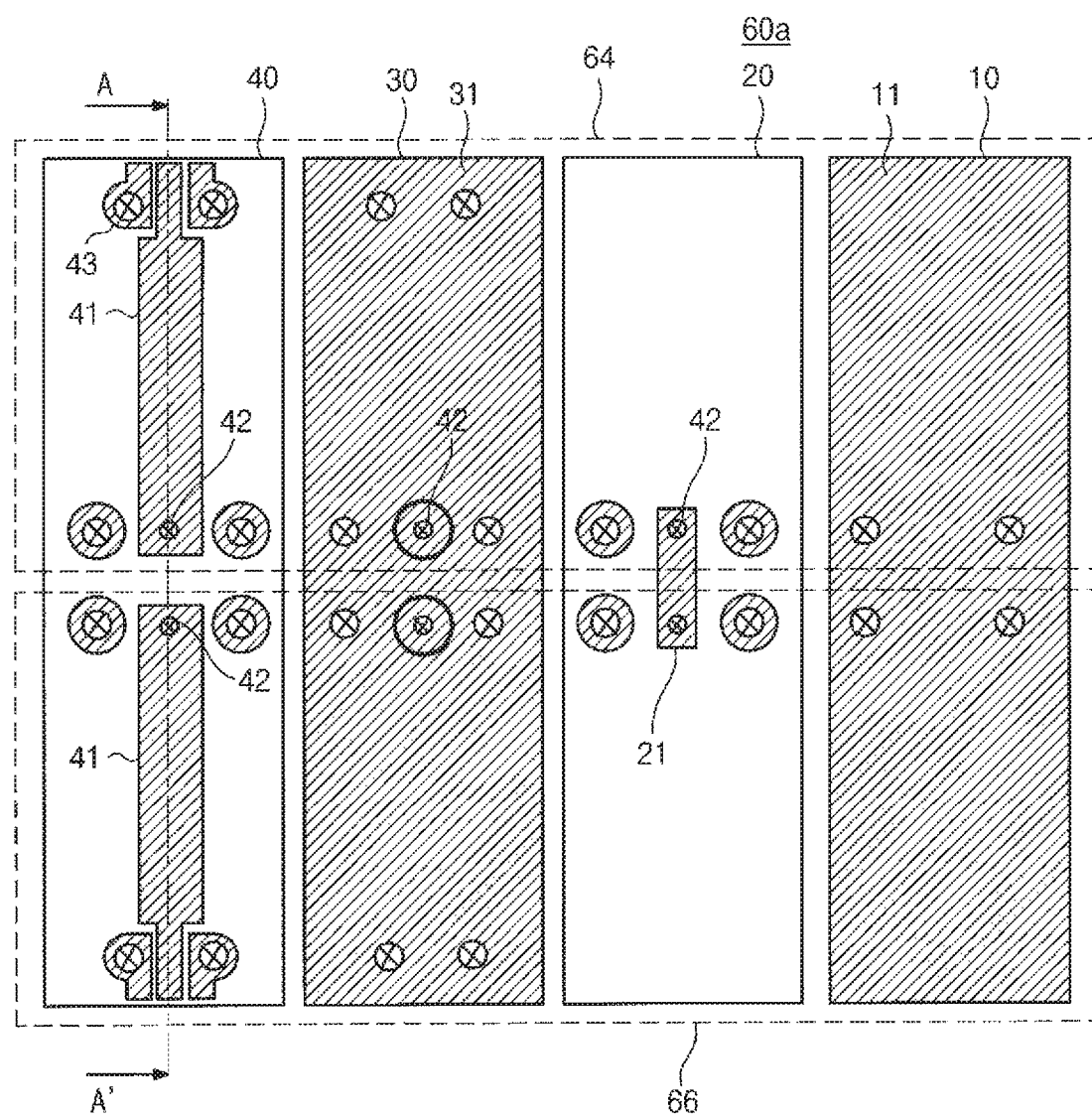
FIG. 7A is a plan view in which first to fourth conductive layers of a through calibration standard are laid out side by side.

FIG. 7A is a plan view in which first to fourth conductive layers of a first sample are laid out side by side.

Figure 7B:
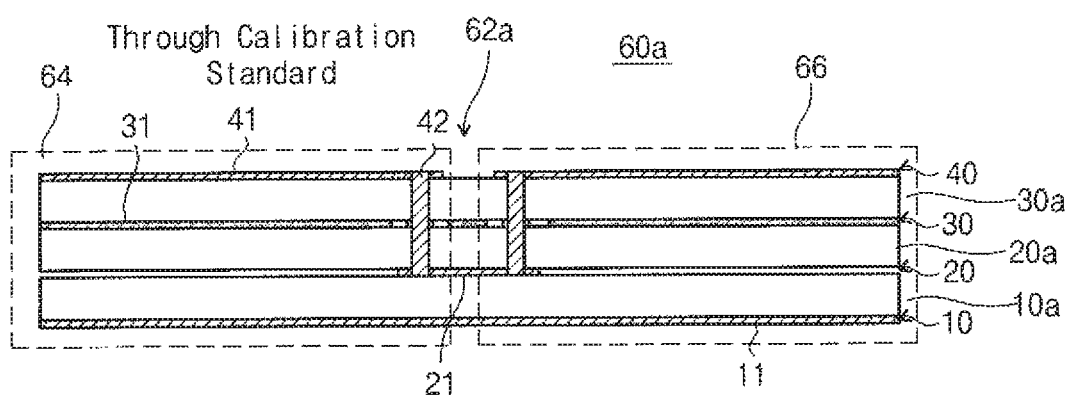
FIG. 7B is a cross-sectional view taken along line A-A' in FIG. 7A.

FIG. 7B is a cross-sectional view taken along line A-A' in FIG. 7A.

Referring to FIGS. 7A and 7B, a first sample 60a includes a through calibration standard 62a, a first error box 64, and a second error box 66. Each of the first error box 64 and the second error box 66 may include a first conductive layer 10 including a grounded first conductive layer 11, a second conductive layer 20 including a lower signal pattern 21, a third conductive layer 30 including a third conductive pattern 31 extending alongside the first conductive pattern 11 and being grounded, and a fourth conductive layer 40 including an upper signal pattern 41 extending alongside the first conductive pattern 11. The upper signal pattern 41 may be connected to the lower signal pattern 21 through a first via 42. An upper auxiliary conductive pattern 43, disposed alongside the upper signal pattern 41, may serve as a pad with which a radio-frequency (RF) probe is in contact.

In the through calibration standard 62a, the lower signal pattern 21 of the first error box 64 and the lower single pattern 21 of the second error box 66 may be connected to each other on a disposition plane on which the second conductive layer 20 is disposed.

Figure 8A:
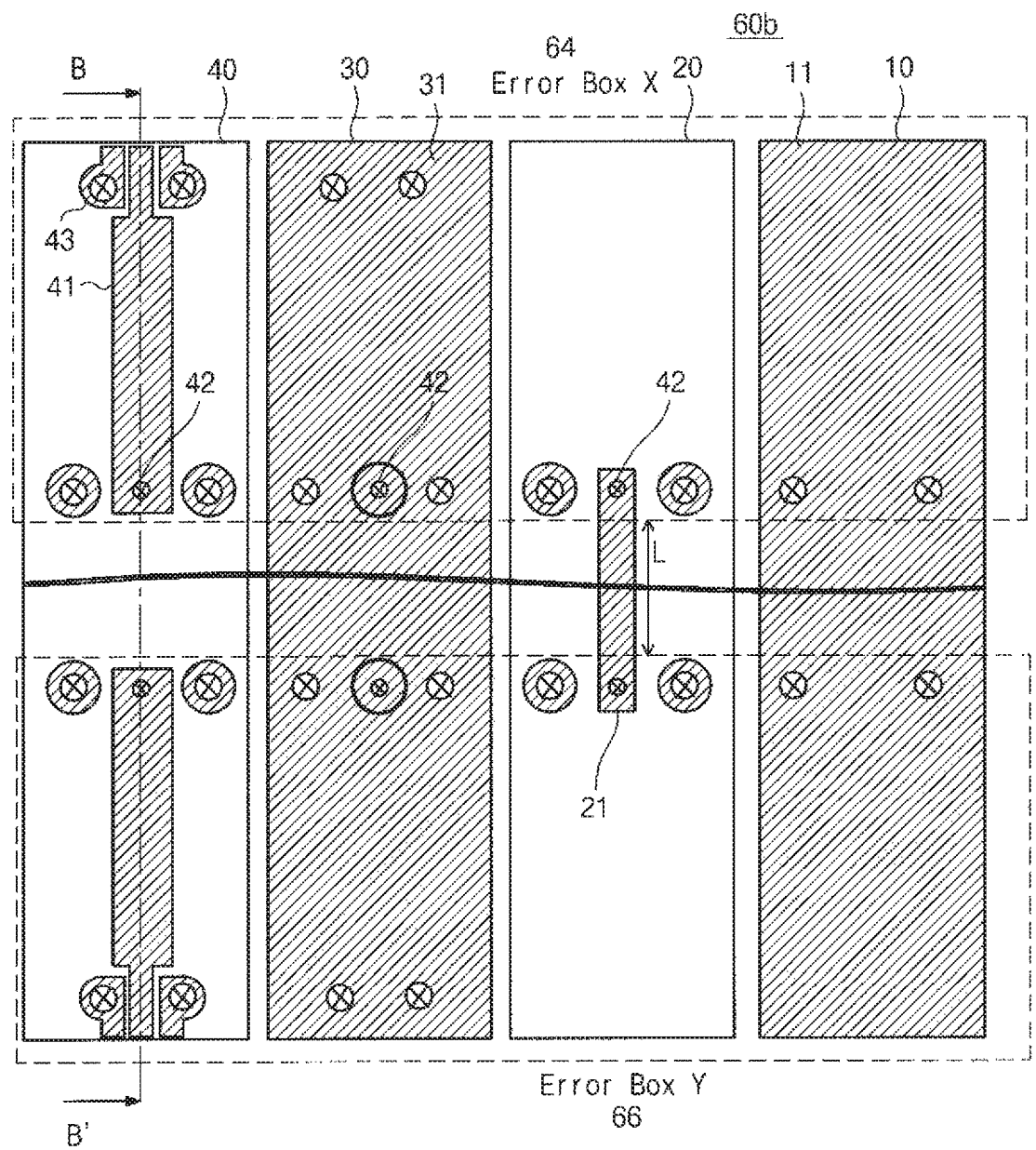
FIG. 8A is a plan view in which first to fourth conductive layers of a line calibration standard are laid out side by side.

FIG. 8A is a plan view in which first to fourth conductive layers of a second sample are laid out side by side.

Figure 8B:
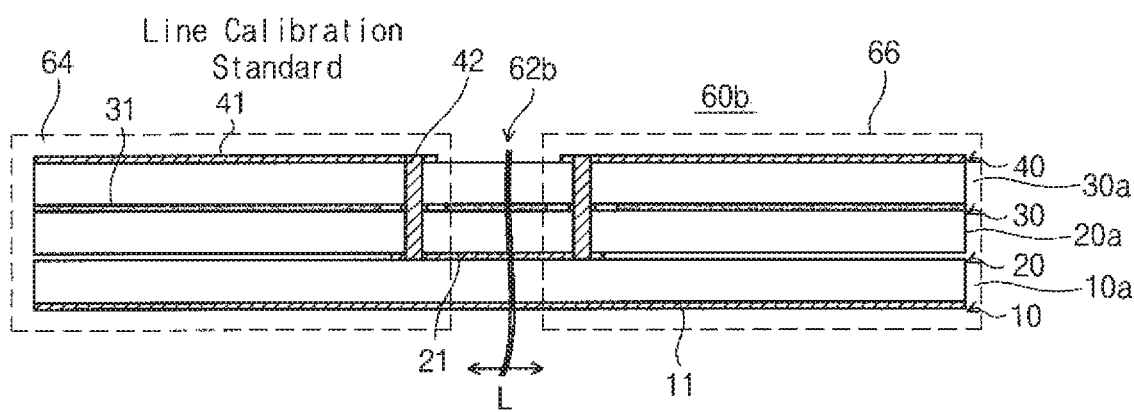
FIG. 8B is a cross-sectional view taken along line B-B' in FIG. 8A.

FIG. 8B is a cross-sectional view taken along line B-B' in FIG. 8A.

Referring to FIGS. 8A and 8B, a second sample 60b includes a line calibration standard 62b, a first error box 64, and a second error box 66. Each of the first error box 64 and the second error box 66 may include a first conductive layer 10 including a grounded first conductive layer 11, a second conductive layer 20 including a lower signal pattern 21, a third conductive layer 30 including a third conductive pattern 31 extending alongside the first conductive pattern 11 and being grounded, and a fourth conductive layer 40 including an upper signal pattern 41 extending alongside the first conductive pattern 11. The upper signal pattern 41 may be connected to the lower signal pattern 21 through a first via 42. An upper auxiliary conductive pattern 43, disposed alongside the upper signal pattern 41, may serve as a pad with which a radio-frequency (RF) probe is in contact.

In the line calibration standard 62b, the lower signal pattern 21 of the first error box 64 and the lower single pattern 21 of the second error box 66 may be connected to each other on a disposition plane, on which the second conductive layer 20 is disposed, to provide a phase difference while having a predetermined distance L.

Figure 9A:
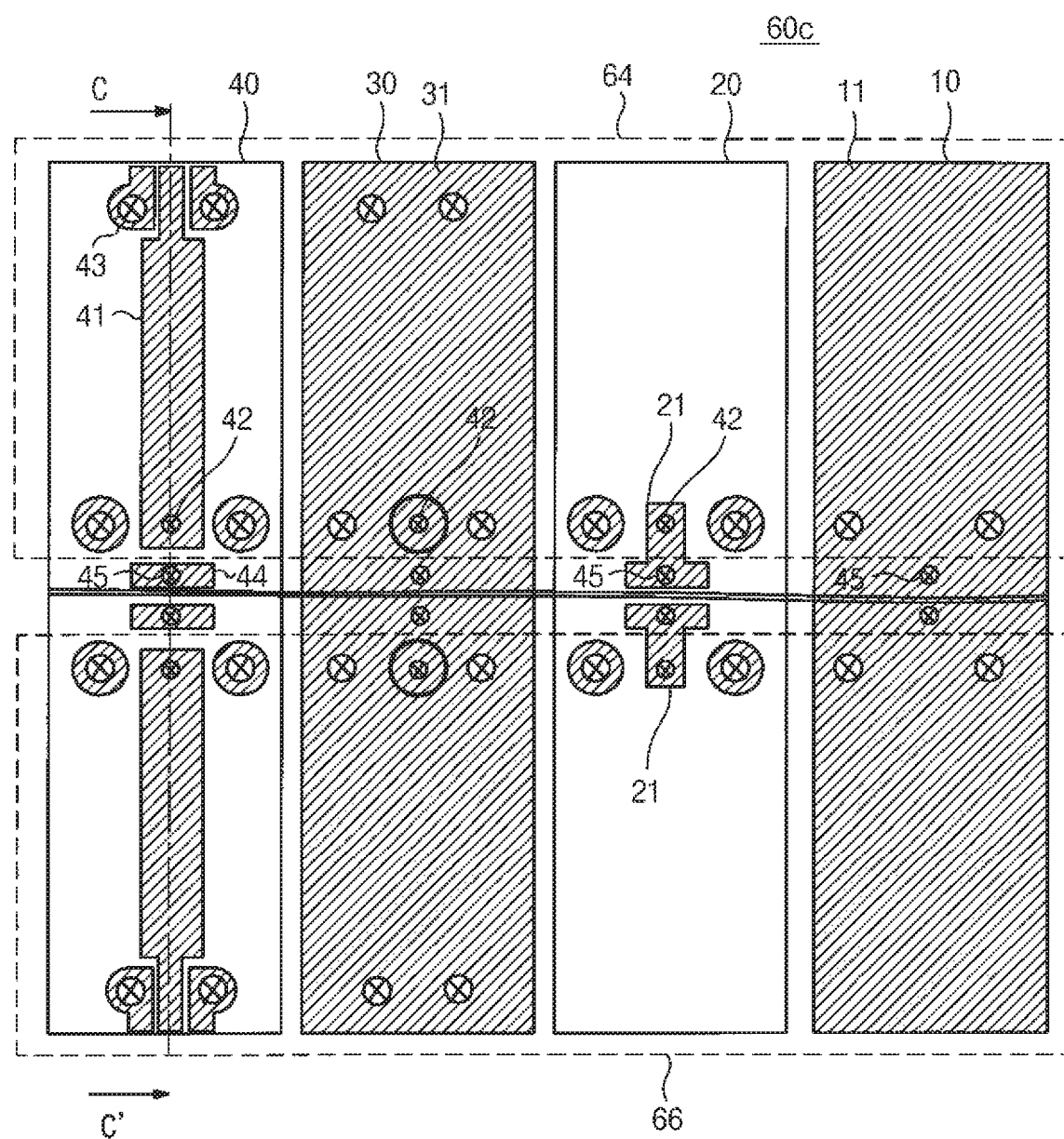
FIG. 9A is a plan view in which first to fourth conductive layers of a reflect calibration standard are laid out side by side.

FIG. 9A is a plan view in which first to fourth conductive layers of a third sample are laid out side by side.

Figure 9B:
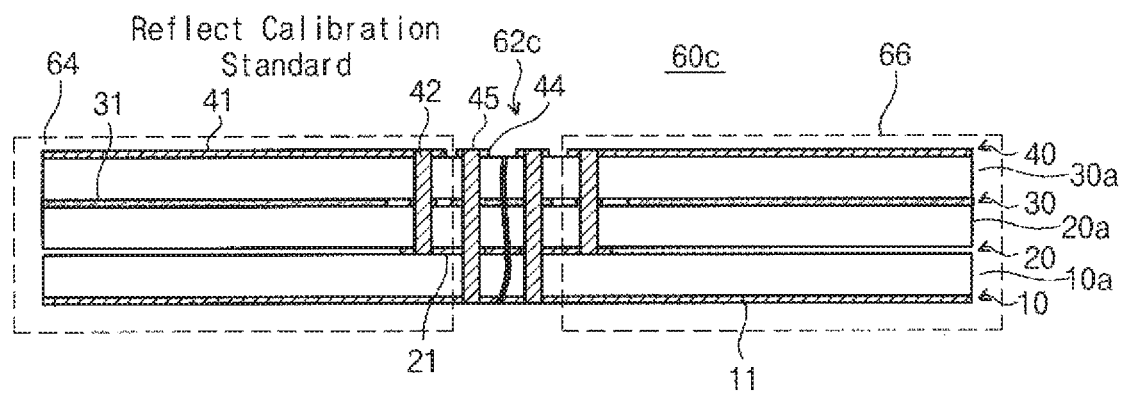
FIG. 9B is a cross-sectional view taken along line C-C' in FIG. 9A.

FIG. 9B is a cross-sectional view taken along line C-C' in FIG. 9A.

Referring to FIGS. 9A and 9B, a third sample 60c includes a reflect calibration standard 62c, a first error box 64, and a second error box 66. Each of the first error box 64 and the second error box 66 may include a first conductive layer 10 including a grounded first conductive layer 11, a second conductive layer 20 including a lower signal pattern 21, a third conductive layer 30 including a third conductive pattern 31 extending alongside the first conductive pattern 11 and being grounded, and a fourth conductive layer 40 including an upper signal pattern 41 extending alongside the first conductive pattern 11. The upper signal pattern 41 may be connected to the lower signal pattern 21 through a first via 42. An upper auxiliary conductive pattern 43, disposed alongside the upper signal pattern 41, may serve as a pad with which a radio-frequency (RF) probe is in contact.

In the reflect calibration standard 62c, the lower signal pattern 21 of the first error box 64 may be connected to the first conductive pattern 11, the second conductive pattern 21, and an upper auxiliary pattern 44, disposed in the fourth conductive layer 40, through a second via 45.

Figure 10A:
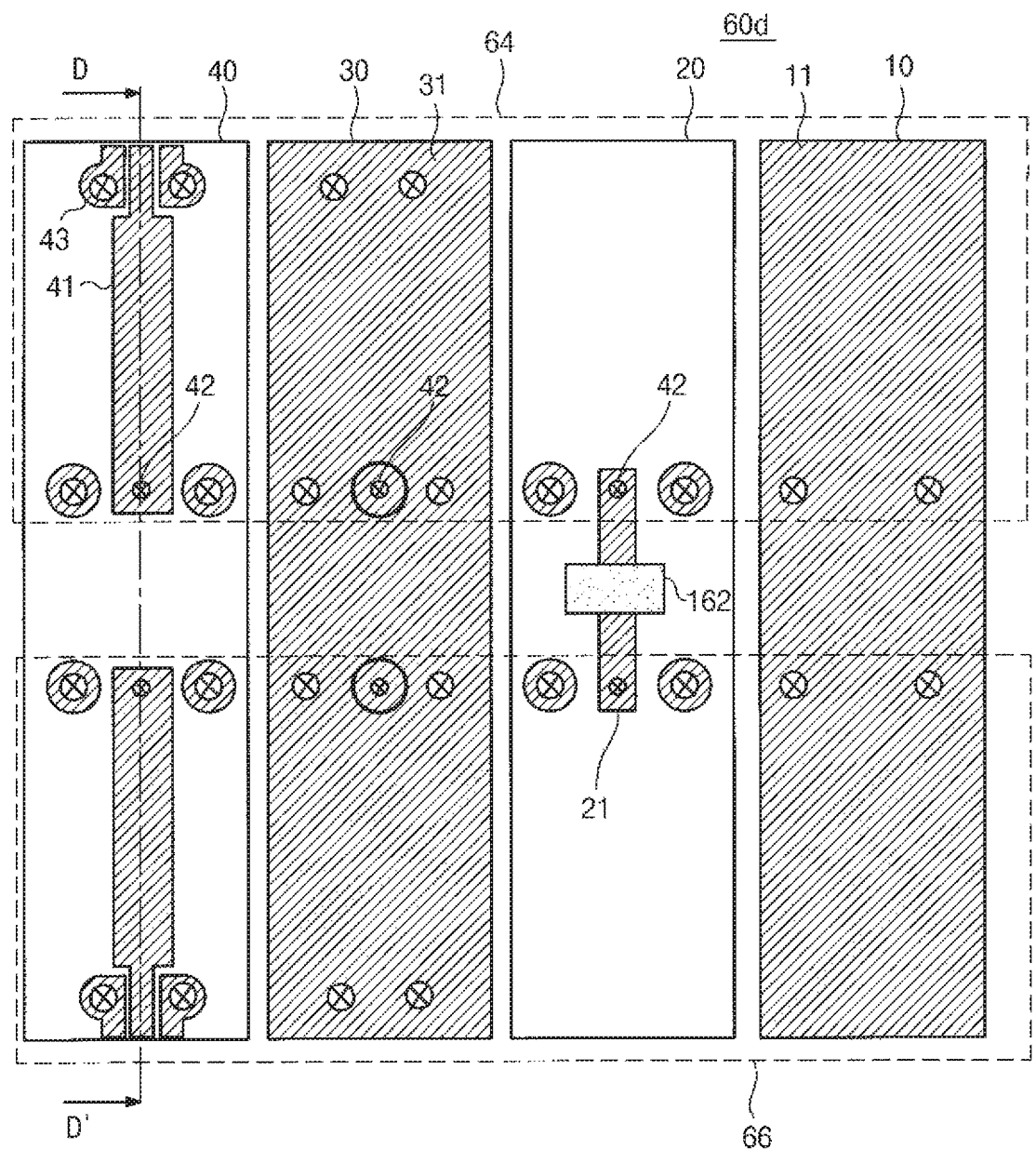
FIG. 10A is a plan view in which first to fourth conductive layers of a test sample are laid out side by side.

FIG. 10A is a plan view in which first to fourth conductive layers of a fourth sample are laid out side by side.

Figure 10B:
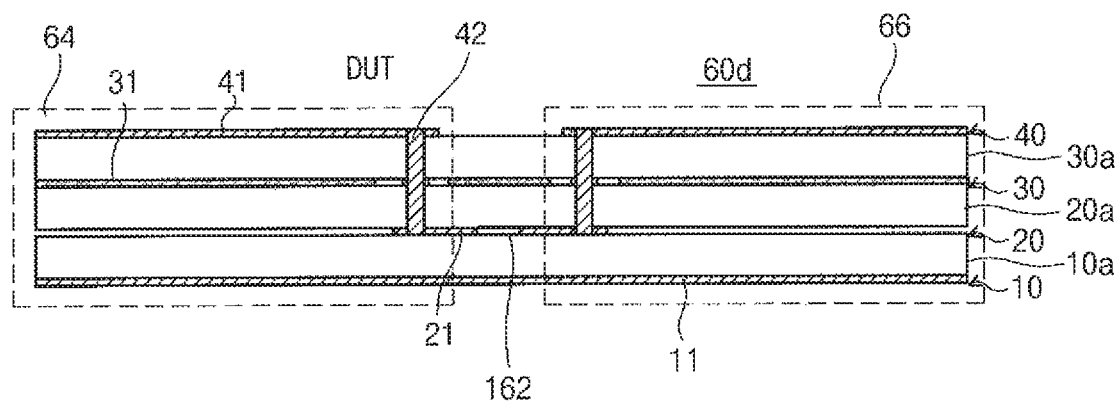
FIG. 10B is a cross-sectional view taken along line D-D' in FIG. 10A.

FIG. 10B is a cross-sectional view taken along line D-D' in FIG. 10A.

Referring to FIGS. 10A and 10B, a fourth sample 60d includes a test sample 162, a first error box 64, and a second error box 66. Each of the first error box 64 and the second error box 66 may include a first conductive layer 10 including a grounded first conductive layer 11, a second conductive layer 20 including a lower signal pattern 21, a third conductive layer 30 including a third conductive pattern 31 extending alongside the first conductive pattern 11 and being grounded, and a fourth conductive layer 40 including an upper signal pattern 41 extending alongside the first conductive pattern 11. The upper signal pattern 41 may be connected to the lower signal pattern 21 through a first via 42. An upper auxiliary conductive pattern 43, disposed alongside the upper signal pattern 41, may serve as a pad with which a radio-frequency (RF) probe is in contact.

The test sample 162 may be an arbitrary device, configured to measure electrical characteristics, and may include a passive component such as a resistor, a capacitor, or an inductor, a filter fabricated by coupling thereof, or an active component. The first to fourth samples 60a to 60d may be formed on the same printed circuit board (PCB) or the same semiconductor substrate.

As set forth above, according to an example embodiment of the present disclosure, impedance characteristics of a device connected to a multilayer substrate through a via may be precisely calibrated.

Although the present disclosure and its advantages have been described in detail, it should be understood that various changes, substitutions and alterations can be made herein without departing from the spirit and scope of the disclosure as defined by the following claims.

What is claimed is:

1. An electromagnetic wave impedance measuring apparatus comprising:
a network analyzer, configured to measure scattering parameters according to a frequency, including a first port and a second port; and
a multilayer substrate, connected to the first port and the second port by a coaxial cable, having a plurality of vias connecting conductive layers to each other, where the connecting conductive layers include three or more conductive layers including at least an uppermost layer, a lowermost layer, and an intermediate layer,
wherein the multilayer substrate comprises:
a test sample between the uppermost layer and the lowermost layer;
a through calibration standard between the uppermost layer and the lowermost layer;
a reflect calibration standard between the uppermost layer and the lowermost layer; and
a line calibration standard between the uppermost layer and the lowermost layer, and
each of the test sample, the through calibration standard, the reflect calibration standard, and the line calibration standard is connected by a first error box having a first one of the plurality of vias, and a second error box having a second one of the plurality of vias, the second one of the plurality of vias having a same structure as the first one of the plurality of vias.

2. The electromagnetic wave impedance measuring apparatus as set forth in claim 1, wherein the multilayer substrate is a four-layer printed circuit board (PCB),
the multilayer substrate includes first to fourth conductive layers,
each of the first error box and the second error box includes:
the first conductive layer including a grounded first conductive layer;
the second conductive layer including a lower signal pattern;
the third conductive layer including a third conductive pattern extending alongside the first conductive layer and being grounded; and
the fourth conductive layer including an upper signal pattern extending alongside the first conductive layer, and
the upper signal pattern is connected to the lower signal pattern through a first via.

3. The electromagnetic wave impedance measuring apparatus as set forth in claim 2, wherein in the through calibration standard, the lower signal pattern of the first error box and the lower signal pattern of the second error box are connected to each other.

4. The electromagnetic wave impedance measuring apparatus as set forth in claim 2, wherein in the reflect calibration standard, the lower signal pattern of the first error box is connected to the first conductive pattern, the second conductive pattern, and an upper auxiliary pattern in the fourth conductive layer through a second via.

5. The electromagnetic wave impedance measuring apparatus as set forth in claim 2, wherein in the line calibration standard, the lower signal pattern of the first error box and the lower single pattern of the second error box are connected to each other to provide a phase difference while having a predetermined distance.

6. A calibration method of electromagnetic wave impedance comprising:
providing a multilayer substrate having a test sample, a through calibration standard, a reflect calibration standard, and a line calibration standard, each connected through a first error box having a first via and connected to a first port of a network analyzer by a coaxial cable and a second error box having a second via and connected to a second port of the network analyzer by the coaxial cable;
measuring a measured through scattering parameter $S_M^{Thru}$ of the through calibration standard, a measured reflection scattering parameter $S_M^{Reflect}$ of the reflect calibration standard, and a measured line scattering parameter $S_M^{Line}$ of the line calibration standard through the network analyzer, respectively;
calculating error terms, constituting the first error box and the second error box, using the measured through scattering parameter $S_M^{Thru}$, the measured reflection scattering parameter $S_M^{Reflect}$, and the measured line scattering parameter $S_M^{Line}$;

measuring a measured test sample scattering parameter $S_M^{DUT}$ of the test sample through the network analyzer; and extracting the measured test sample scattering parameter $S_M^{DUT}$ of the test sample using the error terms, constituting the first error box and the second error box, and extracting a scattering parameter $S^{DUT}$ of the test sample using terms constituting the first error box and the second error box.

7. The calibration method as set forth in claim 6, wherein calculating the error terms constituting the first error box and the second error box comprises:

transforming the measured through scattering parameter $S_M^{Thru}$, the measured reflection scattering parameter $S_M^{Reflect}$, and the measured line scattering parameter $S_M^{Line}$ into a measured through scattering transfer parameter $T_M^{Thru}$, a measured reflection scattering transfer parameter $T_M^{Reflect}$, and a measured line scattering transfer parameter $T_M^{Line}$, respectively; and calculating the error terms by operating the measured through scattering transfer parameter $T_M^{Thru}$, the measured reflection scattering transfer parameter $T_M^{Reflect}$, and the measured line scattering transfer parameter $T_M^{Line}$ using a first equation below, $$T_M = \frac{1}{e_{10}e_{32}}\begin{bmatrix} -\Delta_X & e_{00} \\ -e_{11} & 1 \end{bmatrix} T \begin{bmatrix} -\Delta_Y & e_{22} \\ -e_{33} & 1 \end{bmatrix}$$

where $e_{33}$ denotes directivity of the second error box, $e_{11}$ denotes a first port match, $e_{22}$ denotes a second port match, $e_{10}e_{32}$ denotes transmission tracking, $\Delta_X = e_{00}e_{11} - e_{10}e_{01}$ denotes a determinant of an error matrix of the first error box, and $\Delta_Y = e_{22}e_{33} - e_{32}e_{23}$ denotes a determinant of an error matrix of the second error box.

8. The calibration method as set forth in claim 6, wherein calculating the error terms comprises:

calculating $e_{00}$, $e_{33}$, $e_{10}e_{01}/e_{11}$, and $e_{32}e_{23}/e_{22}$ using the measured line scattering transfer parameter $T_M^{Line}$ and the measured through scattering transfer parameter $T_M^{Thru}$;

calculating $e_{11}$ land $e_{22}$ using the measured through scattering transfer parameter $T_M^{Thru}$ and the measured reflection scattering transfer parameter $T_M^{Reflect}$;

obtaining $e_{10}e_{01}$ using $e_{11}$ and $e_{10}e_{01}/e_{11}$ and obtaining $e_{32}e_{23}$ using $e_{22}$ and $e_{32}e_{23}/e_{22}$; and obtaining $e_{10}e_{32}$ using a second equation below:

$$S_{21M}^{Thru} = (e_{10}e_{32})\frac{1}{1 - e_{11}e_{22}}.$$

9. The calibration method as set forth in claim 6, wherein the test sample, the through calibration standard, the reflect calibration standard, and the line calibration standard are on the same substrate.

* * * * *